United States Patent [19]

Iizuka et al.

[11] Patent Number: 5,028,547
[45] Date of Patent: Jul. 2, 1991

[54] MANUFACTURE OF A COLOR IMAGE SENSOR

[75] Inventors: Yasuo Iizuka; Hirokazu Ichikawa, both of Yokohama, Japan

[73] Assignee: Kabushiki Kaisha Toshiba, Kawasaki, Japan

[21] Appl. No.: 536,736

[22] Filed: Jun. 12, 1990

Related U.S. Application Data

[62] Division of Ser. No. 187,907, Apr. 29, 1988, Pat. No. 4,951,130.

[30] Foreign Application Priority Data

Apr. 30, 1987 [JP] Japan ............................. 62-107303
Jul. 24, 1987 [JP] Japan ............................. 62-184917

[51] Int. Cl.$^5$ ............................................. H01L 31/18
[52] U.S. Cl. ............................................. 437/2; 437/3; 437/4; 437/5; 358/43; 358/44
[58] Field of Search ........................ 437/2, 3, 4, 5, 53; 358/43, 44, 213.29

[56] References Cited

U.S. PATENT DOCUMENTS

| | | | |
|---|---|---|---|
| 4,042,956 | 8/1977 | Yamanaka | 358/44 |
| 4,071,853 | 1/1978 | Yamanaka | 358/44 |
| 4,608,750 | 9/1986 | Switzer | 437/5 |
| 4,630,106 | 12/1986 | Morimura et al. | 358/44 |
| 4,667,392 | 5/1987 | Hine et al. | 437/3 |
| 4,671,853 | 6/1987 | Takayama | 437/3 |
| 4,819,074 | 4/1989 | Sueuki | 358/213.13 |

FOREIGN PATENT DOCUMENTS 57-95786 6/1982 Japan .
59-104610 6/1984 Japan .
61-42950 3/1986 Japan .
62-269588 11/1987 Japan .

OTHER PUBLICATIONS

Morimura et al., "Improved Line Sequential Color Difference System for Single-Chip Color Camera," Report of Institute of Television Engineers of Japan; TEBS87-6; ED 694, Mar. 18, 1983 pp. 41-46.

M. Beedie, "Technology Blend Creates Compact Image Detector with High Video Resolution"; Electronic Design, vol. 32; #17 Aug. 84.

Takemura et al., "New Field Integration Frequency Interleaving Color Television Pickup System for Single-Chip CCD Camera," IEEE Transactions on Electron Devices vol. ED-32; No. 8, Avg., 1985 pp. 1402-1407.

*Primary Examiner*—Brian E. Hearn
*Assistant Examiner*—Kevin Picardat
*Attorney, Agent, or Firm*—Foley & Lardner

[57] ABSTRACT

There is provided an improvement on a solid-state type color image sensor having a color filter arrangement matching the line sequential color difference signal method. A color filter selected from magenta, yellow and cyan for covering the entire area of each picture cell and a color filter of a different color are superposed one upon the other. The color filters covering predetermined ratios of the areas of associated picture cells are preferably formed collectively in a stripe shape.

7 Claims, 7 Drawing Sheets $\dfrac{Mg}{2} + \dfrac{Mg+Cy}{2}$ $\dfrac{Ye}{2} + \dfrac{G(=Ye+Cy)}{2}$ $\dfrac{Mg}{2} + \dfrac{Mg+Ye}{2}$ $\dfrac{Cy}{2} + \dfrac{G(=Ye+Cy)}{2}$

MANUFACTURE OF A COLOR IMAGE SENSOR

This application is a division of application Ser. No. 07/187,907, filed Apr. 29, 1988 now U.S. Pat. No. 4,951,130.

BACKGROUND OF THE INVENTION

The present invention relates to a solid-state color image sensor and a method of manufacturing the same, for use particularly with an electronic still camera.

A solid-state color image sensor has photoelectric conversion cells arranged in a matrix configuration and associated color filters to pick up color signals.

Various color image pickup methods have been proposed heretofore, including such as a tri-plate type method with color separation into three primaries of red, green and blue. Conventional color image pickup methods have been found not satisfactory in sensitivity. A new method solving this problem is known as a line sequential color difference signal method, which is described, for example, by Khono et al. in "Perfect Line Sequential Color Difference Signal and Mono-plate Method", The Institute of Television Engineers of Japan, Technical Report ED836 (Feb., 1985, and by Shin Fujimoto in "Camera System", Journal of the Institute of Television Engineers of Japan, Vol. 40, No. 11, p.1073, 1986. With this method, color signals can be obtained line-sequentially and alternately in the form of color difference signals. This method adopts a field integration mode or a frame integration method to read image signals.

The arrangements of color filters used in the field integration mode and the frame integration mode are shown in FIG. 1.

An image sensor used in the field integration mode is constructed such that color filters of magenta (Mg), cyan (Cy), green (G) and cyan are disposed in this order in the 1st column (1) color filters of green, yellow (Ye), magenta and yellow are disposed in this order in the 2nd column (2), and the two columns with such color filter arrangement are alternately disposed over the whole area of the sensor. In order to read color signals from the sensor with an arrangement of one filter per picture cell, a mixed column readout method is used whereby at the 1st field defining a certain scan line, both the rows (a) and (b) are read out together to obtain a sum of Mg+Cy signal and G+Ye signal, and at the 2nd field defining the next scan line, both the rows (b) and (c) are read out together to obtain a sum of Cy+G signal and Ye+Mg signal. Each photoelectric conversion area is formed in alignment with the center of each color filter. The green (G) filter is obtained by superposing the yellow and cyan filters.

Although the main trend of current video cameras adopts the mixed column readout method, the image resolution thereof is dependent on the size of picture cell so that its vertical resolution is not sufficient for being used by electronic still cameras which require a high resolution.

FIG. 1 shows the arrangement of color filters used in the frame integration mode. Each color filter provided for each picture cell is constructed of two color filters each being a half size as that used in the field integration mode. At the row (a) an Mg/Cy filter and a G/Ye filter are alternately disposed, and at the (b) line a Cy/G filter and an Ye/Mg filter are alternately disposed. In reading color signals, each frame is read in unit of one line such that at the row (a) of the 1st frame, signals Mg+Cy and G+Ye are obtained and at the row (b) of the 2nd frame, signals Cy+G and Ye+Mg are obtained.

However, the material such as casein of a color filter used in the frame integration mode has a poor resolution and hence poor alignment precision at the joint between two halves of the color filter. The obtained color filter may therefore operate stronger at one color than at the other color so that flicker noises are superposed on color difference signals.

SUMMARY OF THE INVENTION

It is an object of the present invention to provide a solid-state color image sensor capable of obtaining a stable and good vertical resolution.

It is another object of the present invention to provide a solid-state color image sensor capable of obtaining color difference signals with less noises.

It is a further object of the present invention to provide a method of manufacturing a solid-state color image sensor as above.

According to one aspect of the present invention, a solid-state color image sensor of the type having color filters of a plurality of different colors formed above a plurality of photosensitive picture cells on a semiconductor substrate surface, comprises color filters of first to third different colors including magenta, yellow and cyan; wherein color filters of said first color are used for color filters each covering the entire area of a first type picture cell, and for color filters each covering a predetermined ratio of the entire area of a second or third type picture cell; color filters of said second color are used for color filters each covering the entire area of said second type picture cell, and for color filters each covering a predetermined ratio of the entire area of a fourth type picture cell; and color filters of said third color are used for color filters each covering the entire area of said third or fourth type picture cell.

The color filters covering predetermined ratios of the entire areas of picture cells are preferably formed collectively in a stripe shape.

The color filters covering predetermined ratios of the entire areas of picture cells may be formed as the upper layer on the lower color filter layer covering the entire areas of picture cells.

According to another aspect of the present invention, a method of manufacturing a solid-state color image sensor of the type forming color filters of a plurality of different colors above a plurality of photosensitive picture cells disposed in a matrix configuration on a semiconductor substrate surface, comprises the following steps (a) to (e) which are carried out sequentially in an optional order and may or may not include those steps carried out at the same time:

(a) forming a color filter of a first color at the position covering the entire area of a first type picture cell, said first color being one of the colors including magenta, yellow and cyan;

(b) forming a color filter of said first color at the position covering a predetermined ratio of the entire area of a second or third type picture cell;

(c) forming a color filter of a second color at the position covering the entire area of said second type picture cell, said second color being another of the colors including magenta, yellow and cyan;

(d) forming a color filter of said second color at the position covering a predetermined ratio of the entire area of a fourth type picture cell; and (e) forming a color filter of a third color at the position covering the entire area of said third or fourth type picture cell, said third color being the other of the colors including magenta, yellow and cyan.

According to the solid-state color image sensor of this invention, each half area of the first to fourth type picture cell is covered with a color filter of one of the colors including magenta, yellow and cyan, and the other half is covered with a color filter of another of the colors including magenta, yellow and cyan. Therefore, it becomes possible to read image signals either at the field integration mode or at the frame integration mode, by properly selecting the positional arrangement of the first to fourth type picture cells in the image sensor. Further, since each picture cell is covered with two different color filters, the vertical resolution of color signals can be improved two times as good as that of an image sensor using one color filter per picture cell. Furthermore, use of the complementary color filters assures the sensitivity of the sensor without lowering it considerably, and use of cyan, yellow and magenta three colors retains a good color reproductivity.

The following advantages can be obtained in manufacturing such a solid-state color image sensor: Since two different color filters are formed on a picture cell without integrally joining them as conventional, the manufacturing thereof is very easy. In addition, one of the two different color filters for respective picture cells are formed collectively in a stripe shape above the picture cells to cover the halves of the entire areas of picture cells. Therefore, even if the position of the stripe color filter displaces up and down or right and left to some degree, the stripe color filter can cover the halves of the entire areas of respective picture cells so long as the stripe color filter is positioned within the area of the picture cells, thus realizing a stable spectrum characteristic.

Other objects and advantages of the invention will be apparent from the following description with reference to the accompanying drawings.

DESCRIPTION OF THE PREFERRED EMBODIMENTS

Figure 2:
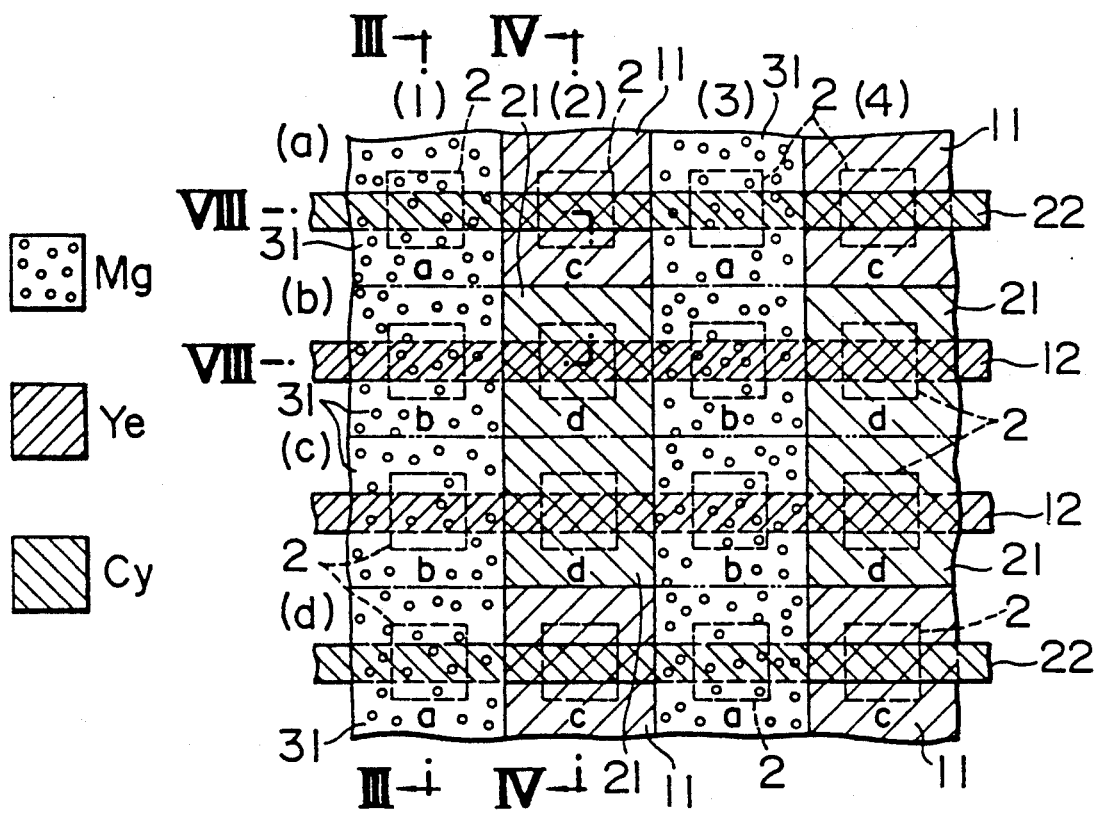
FIG. 2 is a partial plan view showing an embodiment of a solid-state color image sensor according to the present invention.
Figure 3:
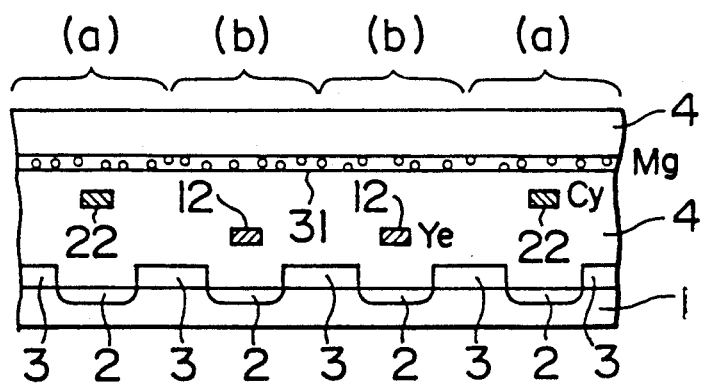
FIGS. 3 and 4 are cross sectional views taken along lines III—III and IV—IV of FIG. 2.
Figure 4:
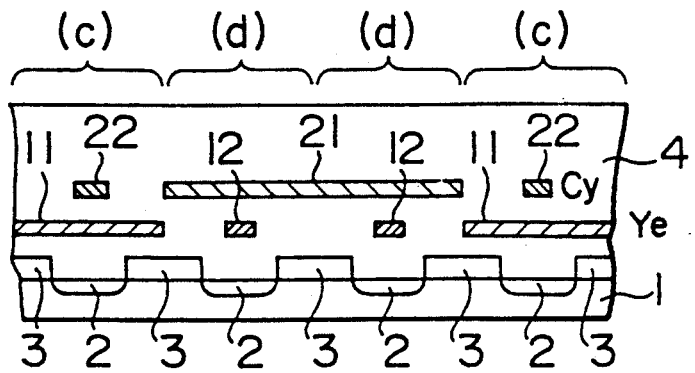

FIG. 2 is a partial plan view of an embodiment of a solid-state color image sensor according to the present invention, and FIGS. 3 and 4 are cross sectional views showing the internal construction of the image sensor, respectively taken along lines III—III and IV—IV of FIG. 2.

The solid-state color image sensor is constructed as having color filters of a plurality of different colors formed on a solid-state image sensor main body or semiconductor substrate with a plurality of photosensitive picture cells. Particularly, as shown in FIGS. 3 and 4, the semiconductor substrate 1 has photosensitive picture cells 2, 2, ... such as photo diodes below the surface thereof. Each of the photosensitive picture cells 2, 2, ... is indicated by a broken-line rectangular in FIG. 2. Aluminum light-shielding films 3, 3, .... are formed above the surface of the semiconductor substrate 1, the opening of the light shielding film 3 corresponding in position to the photosensitive picture cell. Over the semiconductor substrate 1, a transparent layer 4 is formed within which Ye, Cy and Mg color filters are sequentially formed, the colors being complementary colors of blue (B), red (R) and green (G). Particularly, as shown in FIGS. 2 and 4, rectangular Ye color filters 11 are formed at the 2nd and 4th columns at the row (a) and at the 2nd and 4th columns at the row (d) to cover the whole areas c and hence the entire areas of respective picture cells 2 within the areas c. Ye color filters 12 in a stripe shape having a width of a predetermined ratio, e.g. half, the picture cell width are formed at the rows (b) and (c) as shown in FIGS. 2 to 4, each Ye color filter 12 traversing substantially at the center of each picture cell 2 and covering a predetermined ratio, e.g. a half of the entire area of each picture cell within the areas b and d. As shown in FIGS. 2 and 4, rectangular Cy color filters 21 are formed at the 2nd and 4th columns at the rows (b) and (c) to cover the whole areas d and hence the entire areas of respective picture cells 2 within the areas d. Cy color filters 22 in a stripe shape having a width half the picture cell width are formed at the rows (a) and (d) as shown in FIGS. 2 to 4, each Cy color filter 22 traversing substantially at the center of each picture cell 2 and covering a half of the entire area of each picture cell within the areas a and c. As shown in FIGS. 2 and 3, rectangular Mg color filters 31 are formed at the 1st and 3rd columns to cover the whole areas a and b and hence the entire areas of respective picture cells within the areas a and b.

Figure 5A:
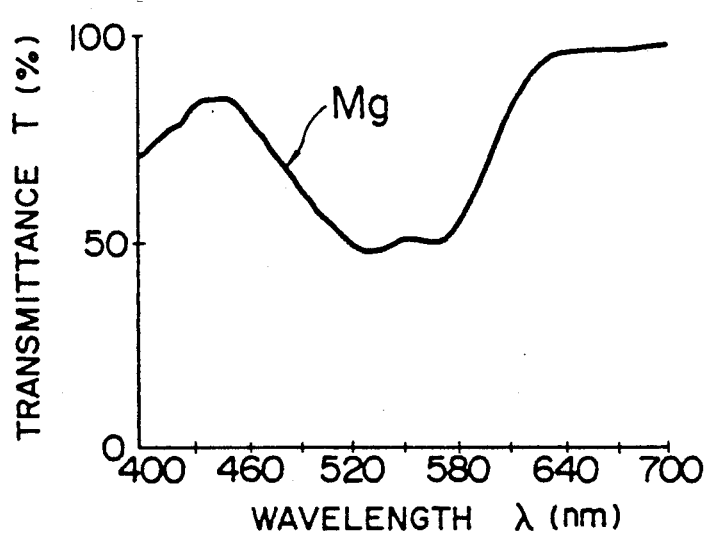
FIGS. 5A to 5C show spectrum characteristics of Mg, Cy and Ye color filters used in the present invention.
Figure 5B:
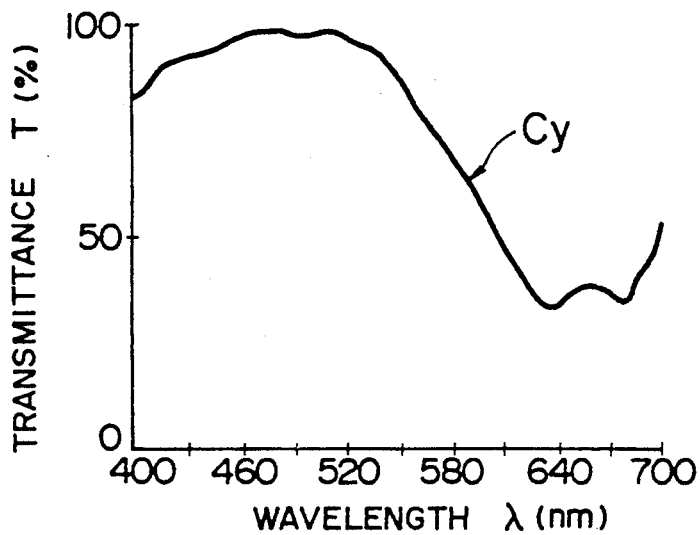
Figure 5C:
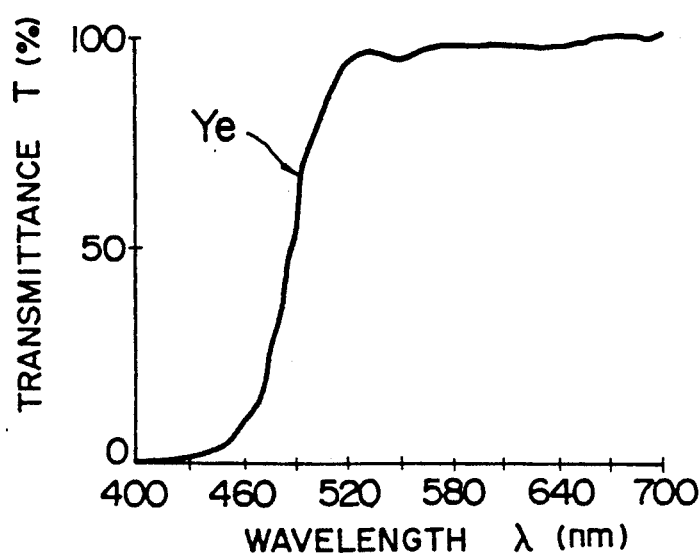

FIGS. 5A to 5C show the spectrum transmittance characteristics of Mg, Cy and Ye color filters of this invention, each of which shows an output of each picture cell 2 assuming that only one of Mg, Ye and Cy color filters covers the entire area of the picture cells shown in FIG. 2. In other words, the Mg, Cy and Ye color filters are used which have been subjected to the coloring to obtain the characteristics shown in FIGS. 5A to 5C, respectively. The coloring density of Mg in particular has a transmittance of 40 to 60% at a wavelength of 550 nm.

Figure 6A:
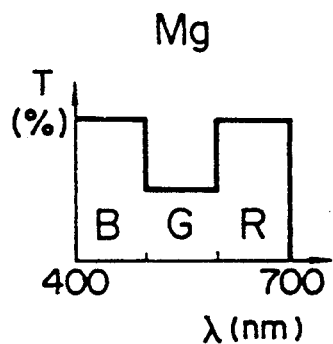
FIGS. 6A to 6C are schematic diagrams of the spectrum characteristics shown in FIGS. 5A to 5C.
Figure 6B:
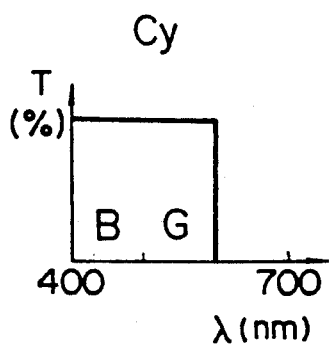
Figure 6C:
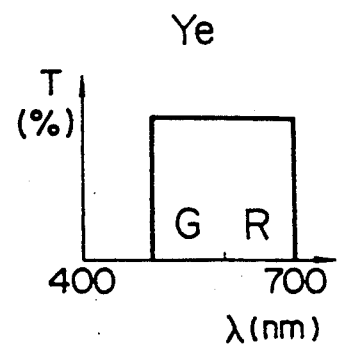

FIGS. 6A to 6C are schematic diagrams showing the characteristics of FIGS. 5A to 5C, respectively.

Figure 7A:
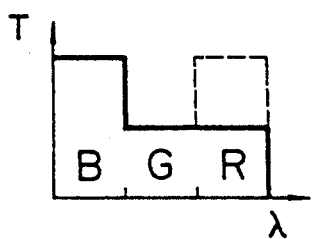
FIGS. 7A to 7D show output characteristics of picture cells respectively at areas (a) to (d) shown in FIG. 2.
Figure 7C:
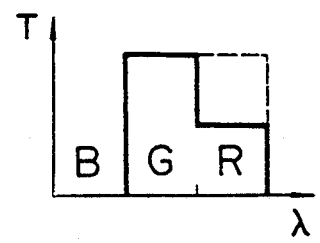
Figure 7B:
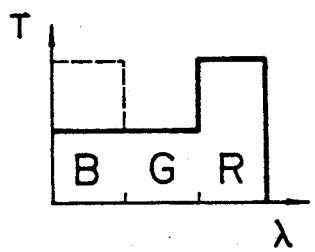
Figure 7D:
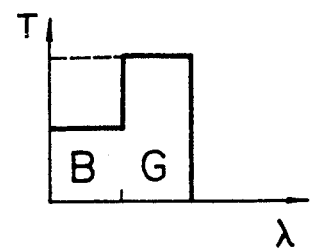

The transmittance characteristics at the areas a to d of the solid-state color image sensor with the color filters having the characteristics of FIGS. 6A to 6C (5A to 5C) and constructed as shown in FIGS. 2 to 4 are shown in FIGS. 7A to 7D. Particularly, at the area a, a half of the entire area of the photosensitive picture cell 2 is covered with only Mg color filter 31 and the remaining half of the picture cell is covered with both Mg color filter 31 and Cy color filter 22. Therefore, the picture cell 2 at the area a can be considered as being covered by a color filter $[Mg/2+(Mg+Cy)/2]$. An output from the picture cell 2 at the area a therefore becomes as shown in FIG. 7A which shows that the R component was cut by Cy as indicated by a broken line. Similarly, picture cells 2 at areas b to d are covered with color filters $[Mg/2+(Mg+Ye)/2]$, $[Ye/2+(Ye+Cy)/2]=[Ye/2+G/2)]$ and $[Cy/2+(Ye+Cy)/2]=[Cy/2+G/2]$, respectively. The outputs from the picture cells 2 at the areas b to d are shown in FIGS. 7B to 7D. An output shown in FIG. 7B indicates that the B component of Mg was eliminated by Ye, an output shown in FIG. 7C indicates that the R component of Ye was eliminated by Cy, and an output shown in FIG. 7D indicates that the B component of Cy was cut by Ye.

Since two different color filters are formed on each photosensitive picture cell at each line of the solid-state color image sensor, it becomes possible to read image signals not only in the field integration mode but also in the frame integration mode. Moreover, each horizontal scan of picture cells can produce two different color difference signals $[Mg/2+(Mg+Cy)/2]-[Ye/2+G/2]$ and $[Mg/2+(Mg+Ye)/2]-[Cy/2+G/2]$, where $G=Ye+Cy$, and also a constant value $(Mg+Ye+Cy)$ can always be obtained as a luminance signal.

Thus, the vertical resolution of color signals can be obtained which is two times as high as the conventional solid-state color image sensor. Such high resolution is particularly suitable for those solid-state image sensors of electronic still cameras which require a high vertical color signal resolution. Further, since complementary type color filters are used, a high sensitivity can be maintained. Also, use of Cy, Ye and Mg three colors enables a good color reproductivity in the line sequential color difference signal method.

The stripe filter with a half of the picture cell width can be formed within the area of the picture cell without failure so that a slight displacement of patterns hardly causes a change in ratio of areas occupied by two different filters and hence a change in spectrum transmittance, thus achieving a stable characteristic.

FIGS. 8A to 8E are cross sectional views each showing a different process of an embodiment of a manufacturing method of the solid-state color image sensor. Each cross section showing the process corresponds to that taken along line VIII(E)-VIII(E). shown in FIG. 2. The embodiment of the method of manufacturing a solid-state color image sensor will be described with reference to FIGS. 8A to 8E.

Figure 8A:
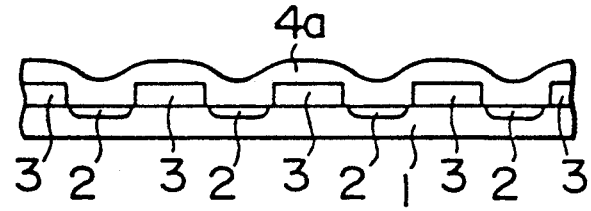
FIGS. 8A to 8E are cross sectional views showing the processes of one embodiment of the method of manufacturing the solid-state color image sensor according to the present invention.

Referring to FIG. 8A, reference numerals 1 to 3 denote the same elements described previously. Namely, reference numeral 1 denotes a semiconductor substrate, 2 a photosensitive picture cell, and 3 an aluminum light-shielding film. A transparent layer (base layer) 4a of acrylic resin type is formed on the solid-state image sensor constructed of the elements 1 to 3. The transparent layer 4a makes flat the uneven surface of the semiconductor substrate 1 caused during the wafer process, and serves to tightly contact thereon a coloring resist for coloring it into Ye at the succeeding process.

Figure 8B:
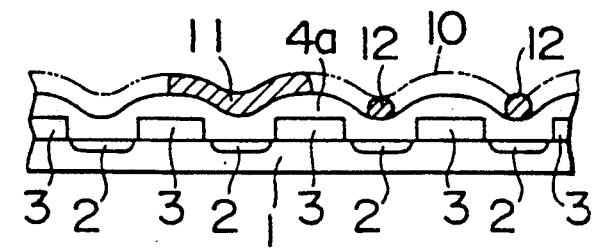

Next, as shown in FIG. 8B, a coloring resist layer 10 such as case in having a coloring function is formed on the transparent layer 4a. The coloring resist layer 10 is used for forming the Ye color filters 11 and 12 by patterning it by means of the photo engraving process (PEP) and leaving only the necessary portions. The left coloring resist layer is subjected to coloring by using an Ye coloring liquid to thereby form the Ye color filters 11 and 12.

Figure 8C:
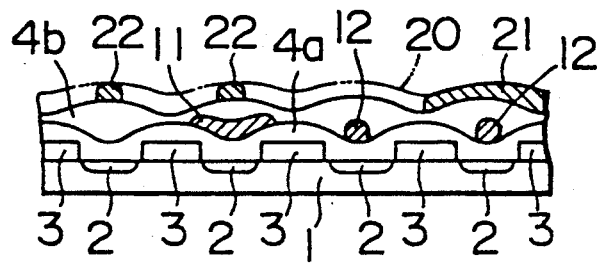

Next, as shown in FIG. 8C, formed on the Ye color filters 11 and 12 and the transparent layer 4a is a transparent resist layer 4b of acrylic resin type similar to the transparent layer 4a. On the transparent layer 4b, a coloring resist layer 20 like the coloring resist layer 10 is formed. The coloring resist layer 20 is used to form the Cy color filters 21 and 22 by patterning it by the PEP similar to the case of the coloring resist layer 10 and leaving only the necessary portions. The left coloring resist layer is subjected to coloring by using a Cy coloring liquid to thereby form the Cy color filters 21 and 22.

Figure 8D:
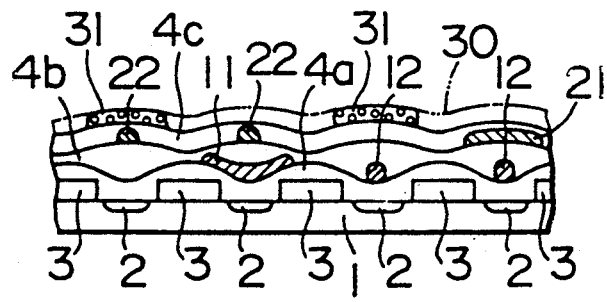
Figure 8E:
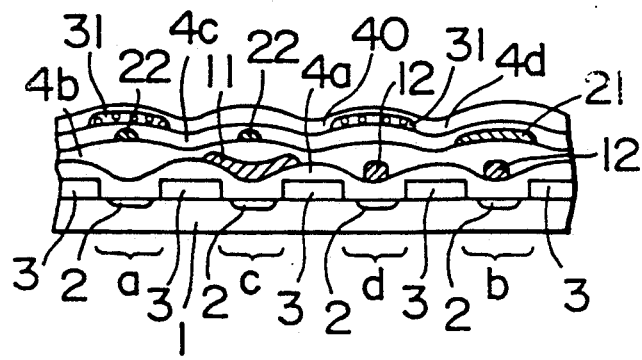

Thereafter, as shown in FIG. 8D, formed on the Cy color filters 21 and 22 and the transparent layer 4b is a transparent resist layer 4c of acrylic resin type similar to the transparent layers 4a and 4b. On the transparent layer 4c, a coloring resist layer 30 like the coloring resist layers 10 and 20 is formed. The coloring resist layer 30 is used to form the Mg color filter 31 by patterning it by the PEP similar to the case of the coloring resist layers 10 and 20 and leaving only the necessary portions. The left coloring resist layer is subjected to coloring by using an Mg coloring liquid to thereby form the Mg color filter 31. Thereafter, formed on the Mg color filter 31 and the transparent layer 4c is a transparent layer 4d like the transparent layers 4a to 4c. The transparent layer 4d serves as an over-coat (passivation) layer.

In the method of manufacturing the solid-state color image sensor according to the present invention, two different color filters per picture cell are independently formed without adopting the method of integrally joining two different color filters on a picture cell as conventional. Therefore, each color filter can be formed easily. Specifically in forming a color filter covering a half of the entire area of each picture cell, a stripe shape color filter is used so that even the position of the color filter displaces up and down or right and left, a half of the entire area of the picture cell is always covered with the stripe color filter so long as it is positioned within the entire area of the picture cell. As a result, a solid-state color image sensor having a stable spectrum characteristic can be formed with ease.

Figure 1:
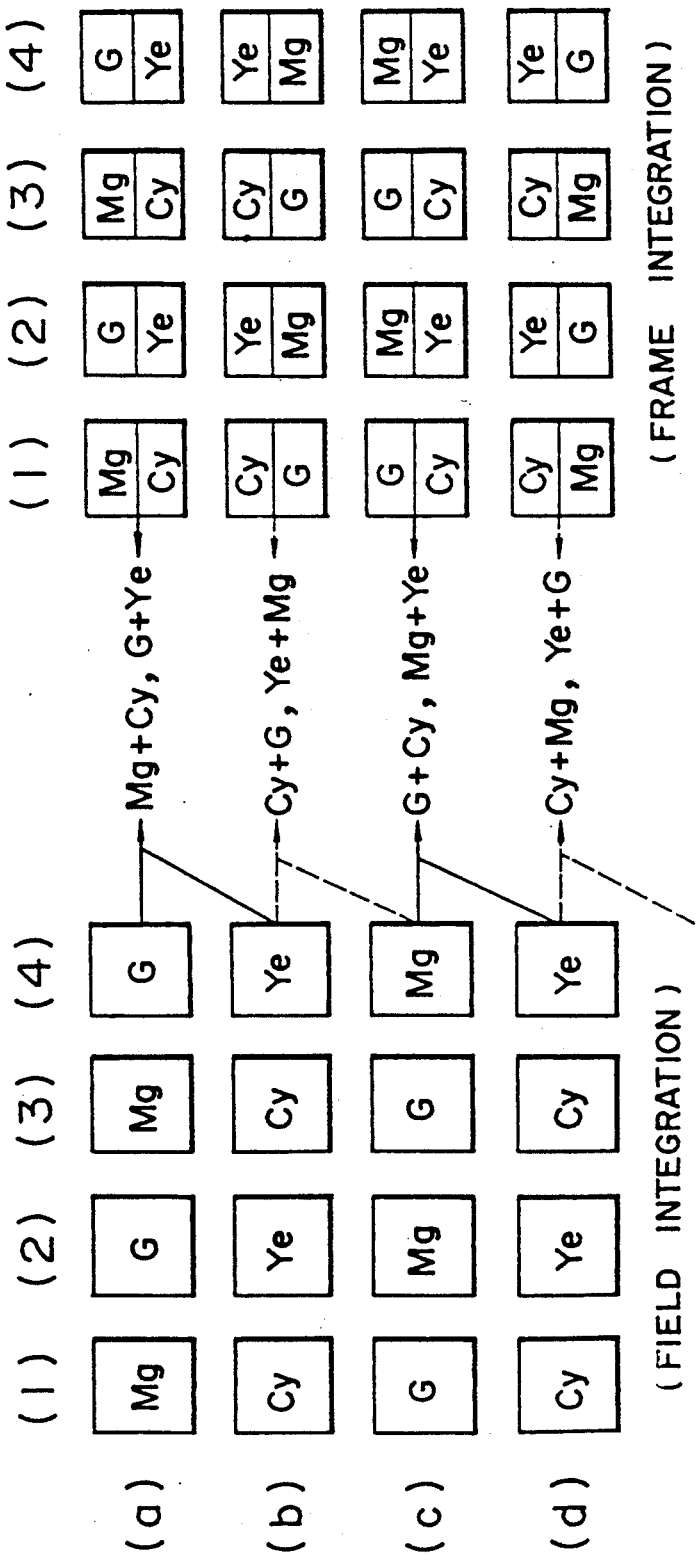
FIG. 1 shows the arrangement of color filters used in solid-state color image sensors heretofore proposed.
Figure 9:
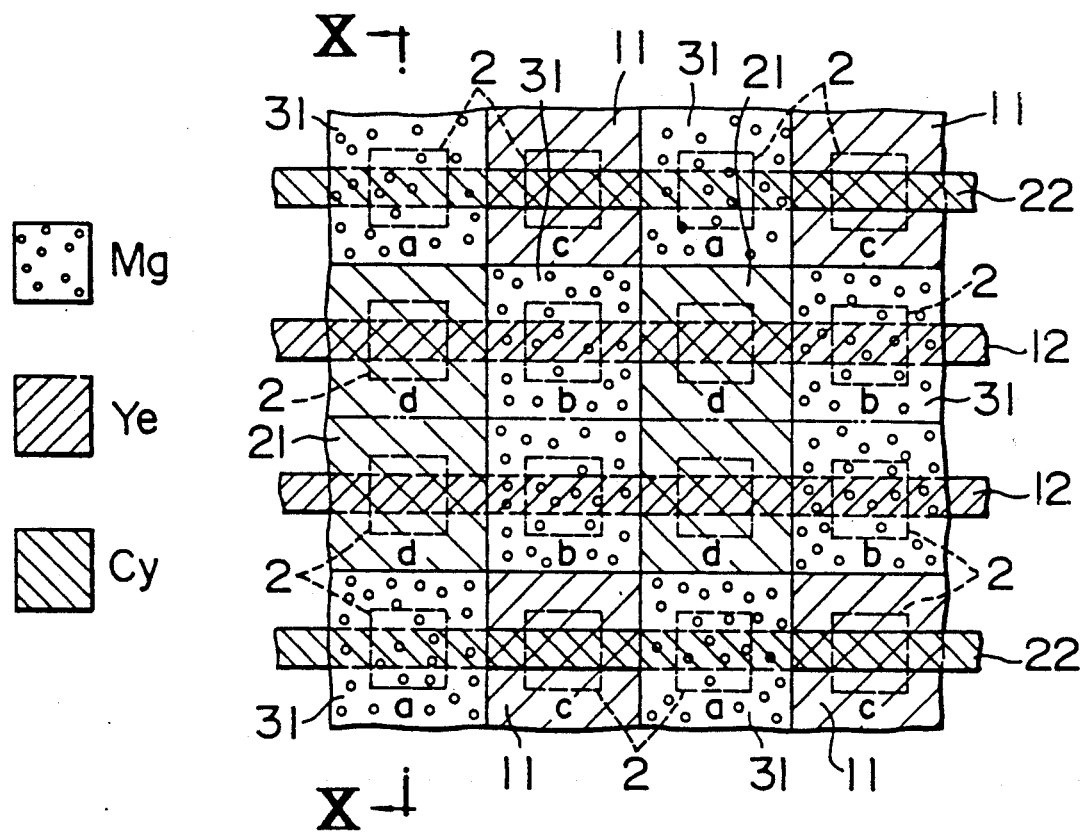
FIG. 9 is a partial plan view showing another embodiment of the solid-state color image sensor according to the present invention.

FIG. 9 shows another embodiment of the solid-state color image sensor according to the present invention. The embodiment shown in FIG. 9 has the same construction except that the positional order of areas a to d is different from the embodiment shown in FIG. 1. As the manufacturing method for this embodiment, the method as described with FIG. 8 may be used.

In the above manufacturing method, the Ye color filters 11 and 12 are formed at the same time, and the Cy color filters 21 and 22 are also formed at the same time. However, in case where a sufficient resolution of the coloring resist layers 10 and 20 for forming the Ye and Cy color filters cannot be obtained, the Ye filters 11 and 12 may be formed independently, and the Cy color filters 21 and 22 may also be formed independently.

Figure 10:
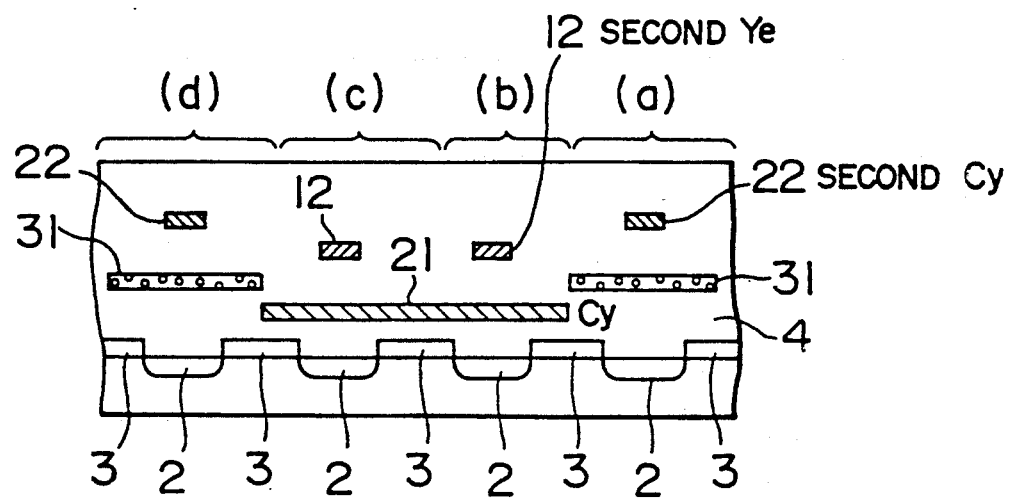
FIG. 10 is a cross sectional view taken along line X—X of FIG. 9.

FIG. 10 is a cross sectional view of the solid-state color image sensor formed in accordance with the above-described, the latter manufacturing method, the sectional view being taken along line X—X of FIG. 9.

In the solid-state color image sensor shown in FIG. 10, the Cy color filter 21 covering the entire area of a picture cell is formed independently from the other Cy color filter 22 covering a half of the entire area of a picture cell, as is different from the case shown in FIG. 4. This arrangement is suitable for obtaining a fine pattern of a very high density solid-state image sensor.

In the embodiment shown in FIG. 9, the underlying Mg, Cy and Ye color filters are formed in units of two vertically consecutive picture cells from the standpoint of manufacturing simplicity. However, all adjacent color filters may use a different color on condition that the Mg and Cy color filters and the Mg and Ye color filters are respectively disposed in the direction along each line.

Figure 11A:
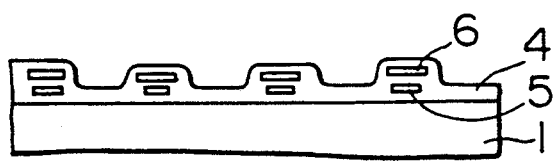
FIGS. 11A to 11E are cross sectional views showing the processes of manufacturing the solid-state color image sensor shown in FIG. 10.

FIGS. 11A to 11E are cross sectional views each showing a different process of the manufacturing method of this invention by which the image sensor having the structure just mentioned above can be realized. First, a transparent layer 4 called a base layer is formed over the surface of a substrate 1 whose photoelectric conversion areas, light-shielding areas (both not shown) and polysilicon wire layers 5 and 6 have been formed already (FIG. 11A). The base layer 4 eliminates the surface unevenness caused during the wafer process, and also improves the tight contact with a coloring resist at the next process.

Figure 11B:
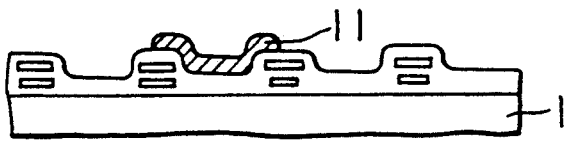

Next, a coloring resist whose main components are casein or the like is coated over the whole surface, which resist is patterned to leave only the necessary portions. The left portions are subjected to coloring to yellow to thus obtain an yellow layer 11 (FIG. 11B).

Figure 11C:
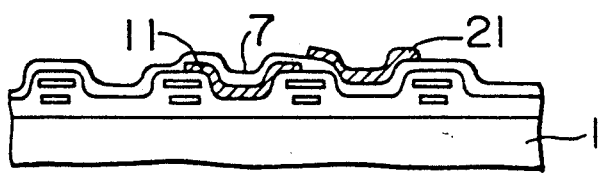

Succeedingly, an intermediate transparent layer 7 is formed on the whole surface to then coat a second coloring resist which is patterned to leave only the necessary portions. The left portions are subjected to coloring to cyan to obtain a cyan layer 21 (FIG. 11C).

Figure 11D:
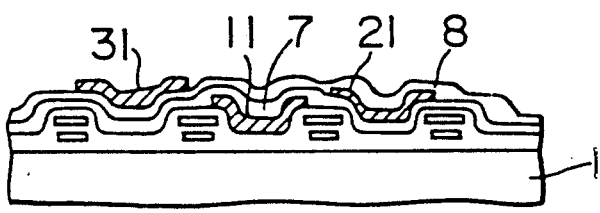
Figure 11E:
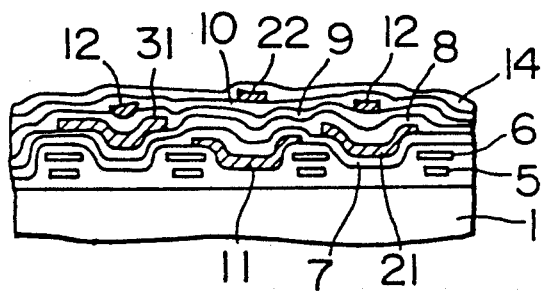

Next, a similar, intermediate transparent layer 8 is formed on the whole surface. A third coloring resist coated upon the transparent layer 8 is patterned to leave the necessary portions. The left portions are subject to coloring to magenta to obtain a magenta layer 9 (FIG. 11D). The density of coloring to magenta is half the density required for a single magenta layer. In order to obtain the density as small as a half, the dipping time into the coloring liquid may be made half or the density of the coloring liquid may be made half.

In the similar manner as above, an intermediate layer 9, a second yellow layer 12, an intermediate layer 10, and a second cyan layer 22 are sequentially formed and lastly, an over-coat layer 14 serving as a passivation layer is formed to complete the color filter manufacturing process.

The order of forming color filter layers is not limited to the above embodiment only. Patterning the color filter may be performed after or before the coloring.

Figure 12A:
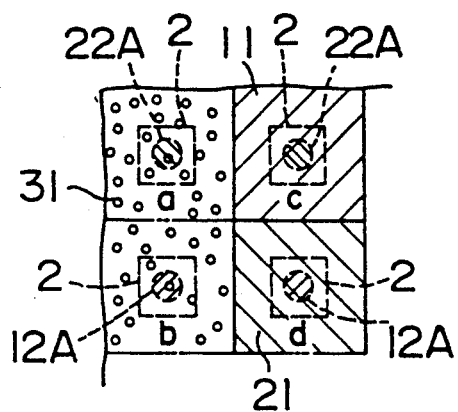
FIGS. 12A and 12B are partial plan views showing other embodiments of the solid-state color image sensor according to the present invention.
Figure 12B:
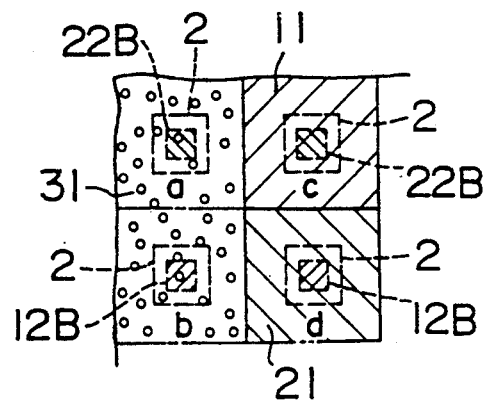

FIGS. 12A and 12B are partial plan views showing other embodiments of the solid-state color image sensor according to the present invention, wherein the left side upper corners of FIG. 2 are partially shown. Instead of the stripe-shaped color filters 22 and 12 shown in FIG. 2, circular color filters 22A and 12A as shown in FIG. 12A or rectangular color filters 22B and 12B as shown in FIG. 12B may be used. Obviously, the area of each color filter 22A, 22B, 12A or 12B is a half of the entire area of each picture cell.

As described above, the ratio of areas occupied by two color filters in a picture cell is generally half. However, a ratio other than half may be also used according to variations in filter material, thickness, color density, etc.

What is claimed is:

1. A method of manufacturing a solid-state color image sensor of the type forming color filters of a plurality of different colors above a plurality of photosensitive picture cells disposed in a matrix configuration on a semiconductor substrate surface, comprising the following steps (a) to (e) which are carried out sequentially in an optional order:
   (a) forming a color filter of a first color at the position covering the entire area of a first type picture cell, said first color being one of the colors including magenta, yellow and cyan;
   (b) forming a color filter of said first color at the position covering a predetermined ratio of the entire area of a second or third type picture cell;
   (c) forming a color filter of a second color at the position covering the entire area of said second type picture cell, said second color being another of the colors including magenta, yellow and cyan;
   (d) forming a color filter of said second color at the position covering a predetermined ratio of the entire area of a fourth type picture cell; and
   (e) forming a color filter of a third color at the position covering the entire area of said third or fourth type picture cell, said third color being the other of the colors including magenta, yellow and cyan.

2. A solid state color image sensor according to claim 1, wherein said predetermined ratio is a half.

3. A method according to claim 1, wherein said steps (a) and (b) and said steps (d) and (e) are carried out at the same time, respectively, to form the color filters covering the entire areas of associated picture cells and the color filters covering halves of the entire areas of associated picture cells, within the same layer.

4. A method according to claim 1, wherein said steps (b) and (d) form a stripe-shaped color filter and are carried out after said steps (a) and (c).

5. A method according to claim 4, wherein said third color is a magenta with twice the transmittance.

6. A method according to claim 5, wherein coloring with twice the transmittance is obtained by making half a dipping time into a coloring liquid.

7. A method according to claim 5, wherein coloring with twice the transmittance is obtained by using a dipping liquid with twice the transmittance.

* * * * *